United States Patent
Chiang et al.

(10) Patent No.: US 10,186,594 B2
(45) Date of Patent: Jan. 22, 2019

(54) SEMICONDUCTOR DEVICE HAVING METAL GATE

(71) Applicant: UNITED MICROELECTRONICS CORP., Hsin-Chu (TW)

(72) Inventors: Chun-Ting Chiang, Kaohsiung (TW); Chi-Ju Lee, Tainan (TW); Chih-Wei Lin, Kaohsiung (TW); Bo-Yu Su, Tainan (TW); Yen-Liang Wu, Taipei (TW); Wen-Tsung Chang, Tainan (TW); Jui-Ming Yang, Taichung (TW); I-Fan Chang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/641,312

(22) Filed: Jul. 4, 2017

(65) Prior Publication Data

US 2018/0358448 A1   Dec. 13, 2018

(30) Foreign Application Priority Data

Jun. 9, 2017 (TW) .............................. 106119178 A

(51) Int. Cl.
*H01L 21/28* (2006.01)
*H01L 29/49* (2006.01)
*H01L 21/02* (2006.01)

(52) U.S. Cl.
CPC .... *H01L 29/4975* (2013.01); *H01L 21/02074* (2013.01); *H01L 21/28088* (2013.01)

(58) Field of Classification Search
CPC ............... H01L 21/28; H01L 21/28088; H01L 21/02074; H01L 29/49; H01L 29/4975
See application file for complete search history.

(56) References Cited

U.S. PATENT DOCUMENTS

| | | | |
|---|---|---|---|
| 8,436,404 B2 | 5/2013 | Bohr | |
| 9,287,263 B1* | 3/2016 | Hsu | ................... H01L 29/66545 |
| 2005/0227479 A1 | 10/2005 | Feng | |
| 2012/0223397 A1* | 9/2012 | Yang | ................. H01L 21/28088 257/411 |
| 2015/0061041 A1* | 3/2015 | Lin | .................... H01L 21/28088 257/410 |
| 2015/0061042 A1* | 3/2015 | Cheng | ................. H01L 29/4966 257/412 |
| 2015/0076623 A1* | 3/2015 | Tzou | ............... H01L 21/823842 257/407 |

(Continued)

*Primary Examiner* — Fazli Erdem
(74) *Attorney, Agent, or Firm* — Winston Hsu

(57) ABSTRACT

The present invention provides a method of manufacturing a gate stack structure. The method comprises providing a substrate. A dielectric layer is then formed on the substrate and a gate trench is formed in the dielectric layer. A bottom barrier layer, a first work function metal layer and a top barrier layer are formed in the gate trench in sequence. Afterwards, a silicon formation layer is formed on the top barrier layer and filling the gate trench. A planarization process is performed, to remove a portion of the silicon formation layer, a portion of the bottom barrier layer, a portion of the first work function metal layer, and a portion of the top barrier layer. Next, the remaining silicon formation layer is removed completely, and a conductive layer is filled in the gate trench.

6 Claims, 4 Drawing Sheets

(56) References Cited

U.S. PATENT DOCUMENTS

2015/0206963 A1* 7/2015 Ho .................... H01L 21/31111
                                                        257/411
2017/0062282 A1* 3/2017 Lin ..................... H01L 27/0922
2017/0110553 A1* 4/2017 Zhou ................... H01L 29/4966
2017/0345722 A1* 11/2017 He .................. H01L 21/823857

* cited by examiner

SEMICONDUCTOR DEVICE HAVING METAL GATE

BACKGROUND OF THE INVENTION

1. Field of the Invention

The invention relates to a manufacturing method for a semiconductor device having a metal gate, and more particularly, to a manufacturing method for a semiconductor device having a metal gate integrated with the gate last process and the high-k last process.

2. Description of the Prior Art

Poly-silicon is conventionally used as a gate electrode in semiconductor devices, such as metal-oxide-semiconductors (MOS). With the trend towards scaling down the size of semiconductor devices, conventional poly-silicon gates face problems such as boron penetration and unavoidable depletion effect leading to inferior performance. Because of these problems, the equivalent thickness of the gate dielectric layer increases, reducing the gate capacitance, and lowering a driving force of the devices. Therefore, work function metals that are suitable for use as high dielectric constant (high-k) gate dielectric layers are employed to replace the conventional poly-silicon gates as control electrodes.

In a complementary metal-oxide semiconductor (CMOS) device, one of the dual work function metal gate structures is used in an NMOS device and the other one is used in a PMOS device. It is well known that compatibility and process controls for the dual metal gate structure is more complicated, while thickness and composition controls for materials used in dual metal gate structure methods are more precise.

Therefore, to improve the performance and the yield of the semiconductor devices, or to lower manufacturing costs and reduce the manufacturing time is an important research direction.

SUMMARY OF THE INVENTION

The present invention provides a gate stack structure. The gate stack structure includes a substrate, a dielectric layer disposed on the substrate, a gate trench disposed in the dielectric layer, a bottom barrier layer disposed in the gate trench, a first work function metal layer disposed on the bottom barrier layer, a top barrier layer disposed on the first work function metal layer, and a titanium silicide nitride (TiSiN) layer disposed on the top barrier layer and directly contacts the top barrier layer.

The present invention provides a method of manufacturing a gate stack structure. The method comprises providing a substrate. A dielectric layer is then formed on the substrate, and a gate trench is formed in the dielectric layer. A bottom barrier layer, a first work function metal layer and a top barrier layer are formed in the gate trench in sequence. Afterwards, a silicon formation layer is formed on the top barrier layer and filling the gate trench. A planarization process is performed to remove a portion of the silicon formation layer, a portion of the bottom barrier layer, a portion of the first work function metal layer, and a portion of the top barrier layer. Next, the remaining silicon formation layer is removed completely, and a conductive layer is filled in the gate trench.

One feature of the invention is that after the top barrier layer is completed, an additional silicon formation layer is additionally formed on the top barrier layer, and a planarization process is then performed to control the depth of the gate trench, and the aspect ratio of the trench can be reduced. Thereby the difficulty in filling the conductive layer is decreased. In addition, in one embodiment of the present invention, the silicon generating layer reacts with the top barrier layer to form a titanium silicide nitride layer which facilitates the enhancement of the efficiency of the NMOS.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
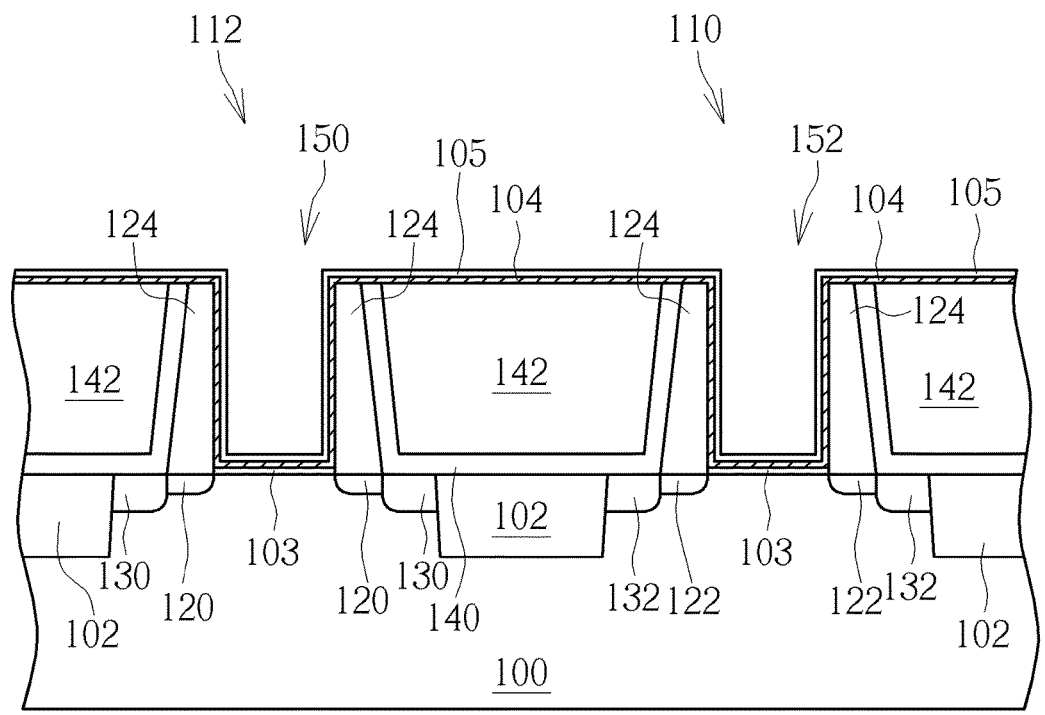
FIGS. 1-7 are schematic drawings illustrating a manufacturing method for semiconductor device having a metal gate provided by a first preferred embodiment of the present invention.

Please refer to FIGS. 1-7, which are drawings illustrating a manufacturing method for semiconductor device having a metal gate provided by a first preferred embodiment of the present invention. As shown in FIG. 1, the preferred embodiment first provides a substrate 100 such as silicon substrate, silicon-containing substrate, or silicon-on-insulator (SOI) substrate. The substrate 100 includes a first semiconductor device 110 and a second semiconductor device 112 formed thereon. A shallow trench isolation (STI) 102 is formed in the substrate 100 between the first semiconductor device 110 and the second semiconductor device 112 for providing electrical isolation. The first semiconductor device 110 includes a first conductivity type, the second semiconductor device 112 includes a second conductivity type, and the first conductivity type and the second conductivity type are complementary. In the preferred embodiment, the first conductivity type is p-type and the second conductivity type is n-type, but not limited thereto.

Please refer to FIG. 1. The first semiconductor device 110 and the second semiconductor device 112 respectively include a dielectric layer (not shown) and a dummy gate (not shown). The dielectric layer can be a conventional silicon oxide ($SiO_2$) layer and the dummy gate can include a polysilicon layer. Furthermore, the first semiconductor device 110 and the second semiconductor device 112 respectively include first lightly doped drains (LDDs) 120 and second LDDs 122, a spacer 124, a first source/drain 130 and a second source/drain 132. Additionally, salicides (not shown) may be respectively formed on the first source/drain 130 and the second source/drain 132. After forming the first semiconductor device 110 and the second semiconductor device 112, a contact etch stop layer (CESL) 140 and an inter-layer dielectric (ILD) layer 142 are selectively formed in sequence. Since the steps and material choices for the abovementioned elements are well-known to those skilled in the art, those details are omitted herein in the interest of brevity. Furthermore, selective strain scheme (SSS) can be used in the preferred embodiment. For example, a selective epitaxial growth (SEG) method can be used to form the first source/drain 130 and the second source/drain 132.

Please still refer to FIG. 1. After forming the CESL 140 and the ILD layer 142, a planarization process is performed to remove a portion of the ILD layer 142 and a portion of the CESL 140 to expose the dummy gates of the first semiconductor device 110 and the second semiconductor device 112. Then, a suitable etching process is performed to remove the dummy gates of the first semiconductor device 110 and the second semiconductor device 112, and thus a first gate trench 150 and a second gate trench 152 are simultaneously formed in the first semiconductor device 110 and the second semiconductor device 112, respectively. The ILD 142 or the substrate 100 is exposed.

Next, an interfacial layer 103 is optionally formed on the substrate 100, and afterwards, a high-k dielectric layer 104 and a bottom barrier layer 105 are sequentially formed on the substrate 100. The high-k dielectric layer 104 can include high-k material such as rare earth metal oxide. The high-k dielectric layer 104 can include material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZrxTi_{1-x}O_3$, PZT), and barium strontium titanate ($BaxSr_{1-x}TiO_3$, BST). In the preferred embodiment, the bottom barrier layer 105 may be a single layer structure or a multiple layer structure, which may include titanium nitride (TiN), tantalum nitride (TaN) or the composition thereof, but not limited to this.

Figure 2:
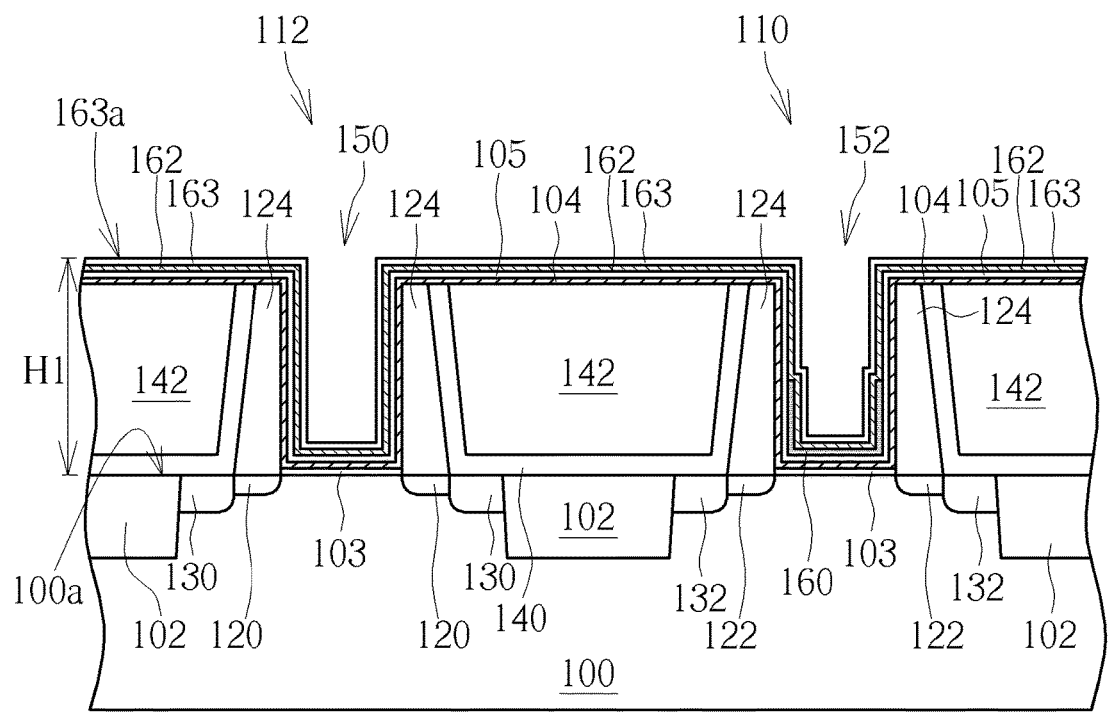

As shown in FIG. 2, a chemical vapor deposition (CVD), a physical vapor deposition (PVD), or an atomic layer deposition (ALD) is performed to form a first work function metal layer 160 in the first gate trench 150. In this embodiment, the first work function metal layer 160 is a p-type work function metal layer and exemplarily includes TiN, TaN, titanium carbide (TiC), tantalum carbide (TaC), tungsten carbide (WC), or aluminum titanium nitride (TiAlN), but not limited to this. Or the first work function metal layer 160 includes an n-type work function metal layer such as titanium aluminide (TiAl), zirconium aluminide (ZrAl), tungsten aluminide (WAl), tantalum aluminide (TaAl), or hafnium aluminide (HfAl), but not limited to this. In addition, the first work function metal layer 160 can be a single-layered structure or a multi-layered structure. It is noteworthy that the first work function metal layer 160 is only disposed in the first gate trench 150, and the first work function metal layer 160 has an U shaped profile.

Please still refer to FIG. 2, another CVD process or a PVD process is then performed to form a second work function metal layer 162. In this embodiment, the second work function metal layer 162 includes an n-type work function metal layer such as titanium aluminide (TiAl), zirconium aluminide (ZrAl), tungsten aluminide (WAl), tantalum aluminide (TaAl), or hafnium aluminide (HfAl), but not limited to this. Additionally, the second work function metal layer 162 can be a single-layered structure or a multi-layered structure, and the second work function metal layer 162 is filled into the first gate trench 150 and the second gate trench 152 simultaneously. Afterwards, a top barrier layer 163 is formed in the first gate trench 150 and the second gate trench 152, the top barrier layer 163 includes material such as TiN, but not limited thereto.

In one embodiment of the present invention, after the top barrier layer 163 is formed, the vertical distance H1 from a top surface 100a of the substrate 100 to a top surface 163a of the top barrier layer 163 is about 700 to 900 angstroms, for example, such as 750 angstroms. Applicants have found that if a conductive layer is directly filled into the first gate trench 150 and the second gate trench 152 at this time, since the aspect ratio of the first gate trench 150 and the second gate trench 152 is high, the conductive layer does not easily fill each trench, and may form a seam in the trench.

Figure 3:
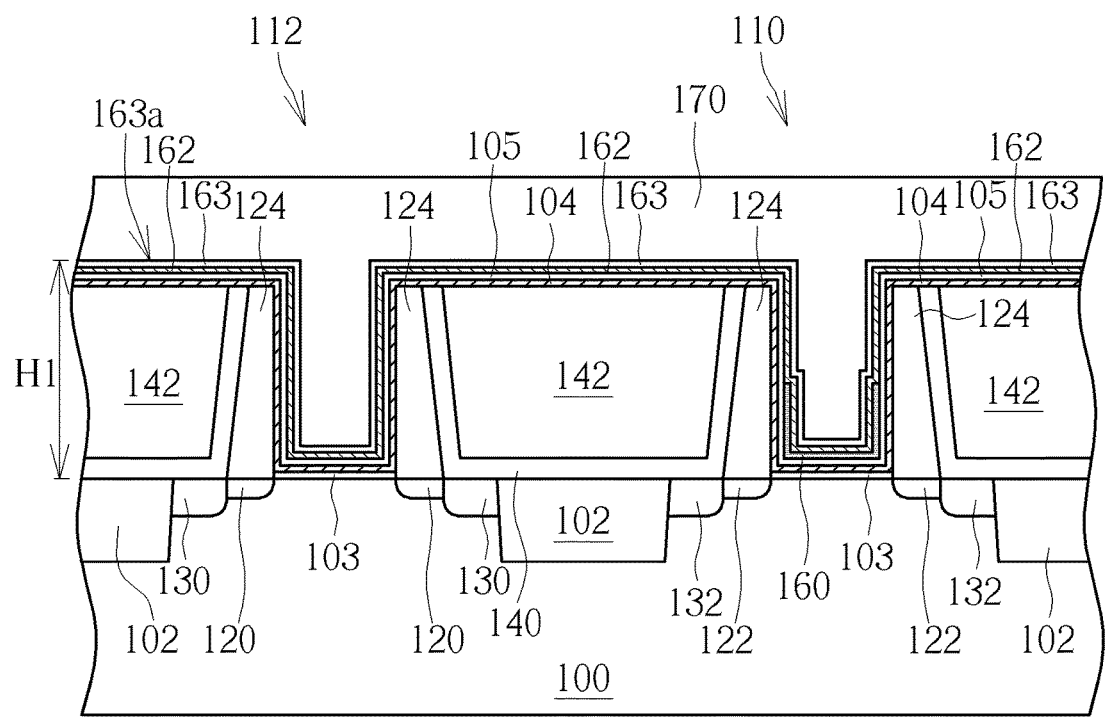
Figure 4:
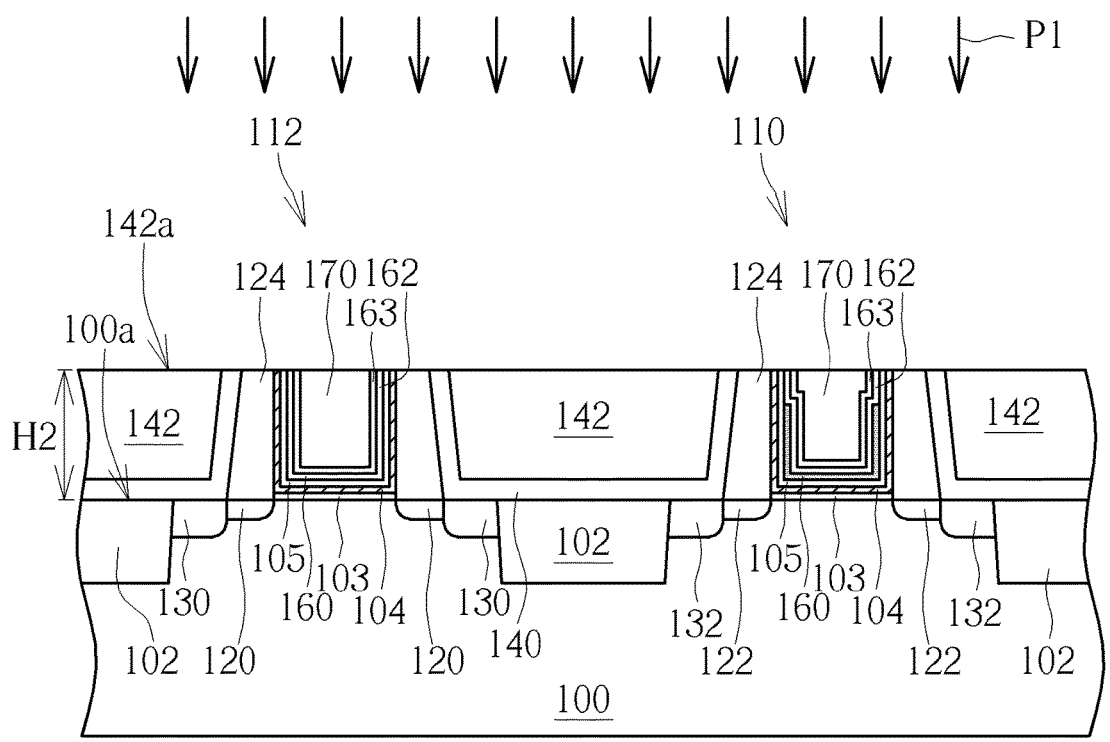

In order to avoid the issue mentioned above, please refer to FIGS. 3-5. Before filling the conductive layer in the first gate trench 150 and the second gate trench 152, as shown in FIG. 3, a silicon formation layer 170 is formed in the first gate trench 150 and the second gate trench 152. For example, the silicon formation layer 170 may be an amorphous silicon layer. As shown in FIG. 4, a planarization process P1 is performed, for example, such as a chemical mechanical polishing (CMP), to remove the extra silicon formation layer 170 on the surface of the ILD 142, and also to remove parts of the high-k layer 104, parts of the bottom barrier layer 105, parts of the second work function metal layer 162, parts of the top barrier layer 163, and parts of the ILD 142, until the surface of the ILD 142 is exposed, and reduce the vertical distance of the substrate 100 to the top surface of the element (the top surface of the ILD 142). In other words, while the planarization process P1 is performed, parts of the ILD 142 are also removed together. In one embodiment of the present invention, after the planarization process P1 is performed, the vertical distance H2 from the substrate 100 to the top surface 142a of the dielectric layer 142 is about 300 angstroms to 500 angstroms. The aspect ratio of the first gate trench 150 and the second gate trench 152 can be effectively reduced compared to the above-described vertical distance H1, therefore, the difficulty of subsequent filling of the conductive layer can be effectively reduced.

Figure 5:
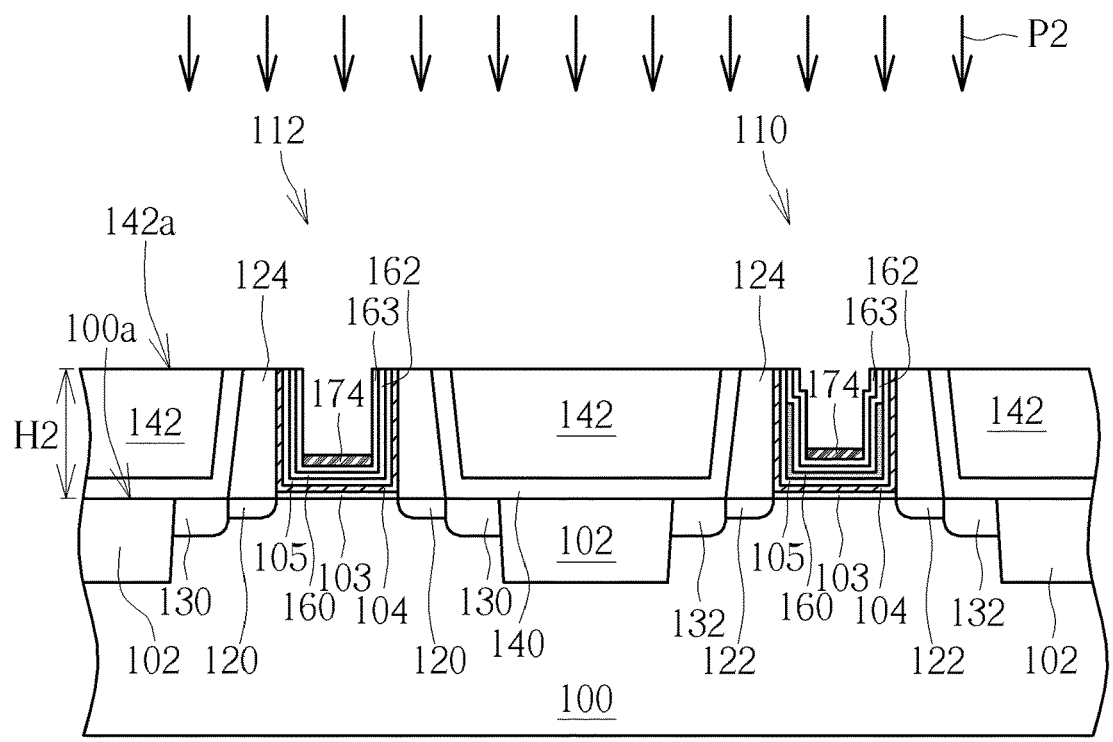

Next, as shown in FIG. 5, an etching process P2 is performed to remove the silicon formation layer 170 from the first gate trench 150 and the second gate trench 152. In the present embodiment, it is preferable to select ammonia water ($NH_4OH$) for etching, which can effectively remove the silicon formation layer 170 and does not destroy other surrounding elements. In addition, the applicant has found that a titanium silicide nitride (TiSiN) layer 174 will be formed at the interface of the silicon generation layer 170 and the top barrier layer 163 (such as TiN), the TiSiN layer 174 still exists on the top barrier layer 163 and directly contacts the top barrier layer 163 after the etching process P2 is performed. In addition, according to the applicant's experiment, the presence of the titanium nitride layer 174 may reduce the threshold voltage (Vt) of the following-formed NMOS, to further increase the efficiency of the NMOS.

Figure 6:
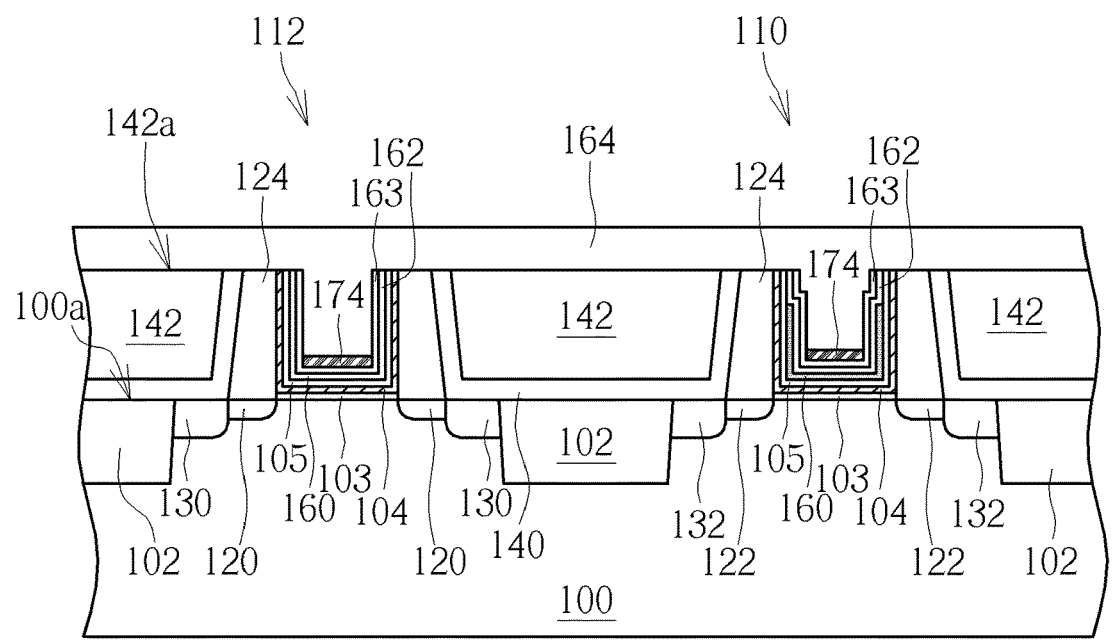
Figure 7:
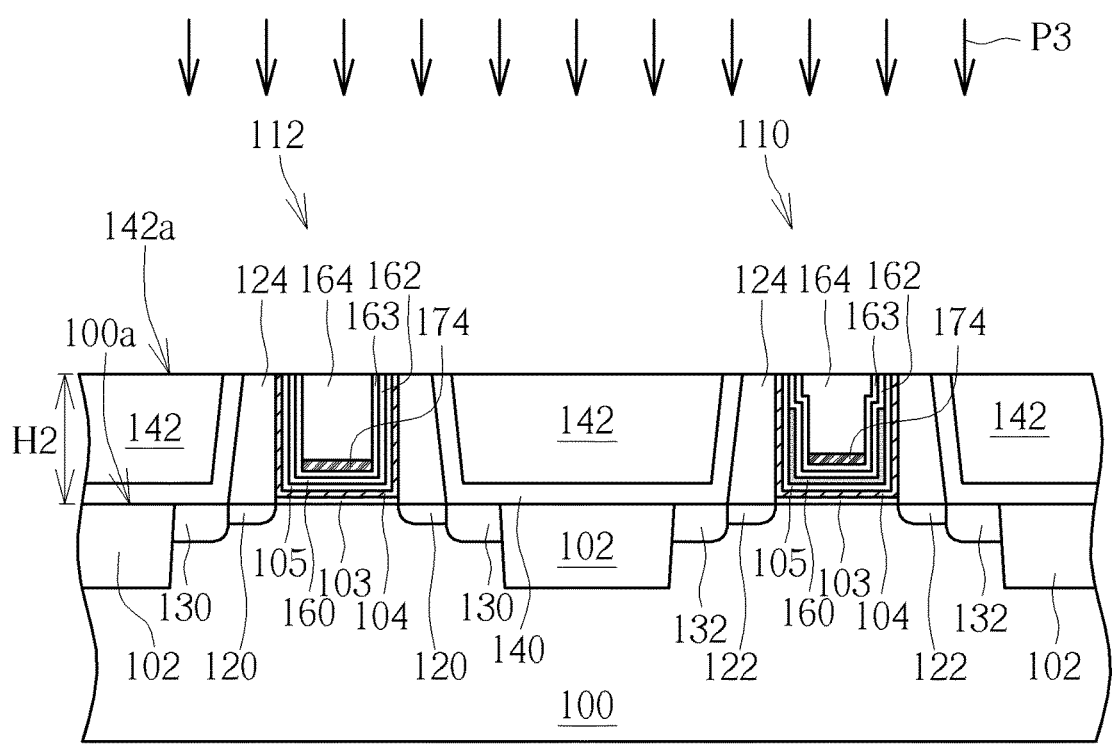

Thereafter, as shown in FIGS. 6-7, a filling metal layer 164 is formed in both of the first gate trench 150 and the second gate trench 152. The filling metal layer 164 is formed to fill up the first gate trench 150 and the second gate trench 152. The filling metal layer 164 includes materials with low resistance and superior gap-filling characteristic, such as Al, TiAl, or titanium aluminum oxide (TiAlO), but not limited to this. Finally, as shown in FIG. 7, a planarization process P3 is performed, such as a CMP (chemical mechanical planarization) process, to remove the extra filling metal layer 164, so as to complete the formation of the first metal gate and the second metal gate.

One feature of the invention is that after the top barrier layer is completed, an additional silicon formation layer is additionally formed on the top barrier layer, and a planarization process is then performed to control the depth of the gate trench, and the aspect ratio of the trench can be reduced. Thereby the difficulty in filling the conductive layer is decreased. In addition, in one embodiment of the present invention, the silicon generating layer reacts with the top barrier layer to form a titanium silicide nitride layer which facilitates the enhancement of the efficiency of the NMOS.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A gate stack structure, comprising:
   a substrate;
   a dielectric layer disposed on the substrate;
   a gate trench disposed in the dielectric layer;
   a bottom barrier layer disposed in the gate trench;
   a first work function metal layer disposed on the bottom barrier layer;
   a second work function metal layer partially disposed on the first work function metal layer in the gate trench, wherein parts of the second work function metal layer contacts the bottom barrier layer directly in the gate trench;
   a top barrier layer disposed on the second work function metal layer; and
   a titanium silicide nitride (TiSiN) layer, disposed on the top barrier layer and directly contacts the top barrier layer, wherein a topmost surface of the titanium silicide nitride layer is lower than a top surface of the dielectric layer.

2. The gate stack structure of claim 1, wherein the distance between a top surface of the substrate and a top surface of the gate trench is between 300 angstroms and 500 angstroms.

3. The gate stack structure of claim 1, wherein the bottom barrier layer comprises a titanium nitride (TiN) or a tantalum nitride (TaN) layer.

4. The gate stack structure of claim 1, wherein the first work function metal layer comprises a titanium aluminum (TiAl) layer.

5. The gate stack structure of claim 1, wherein the top barrier layer comprises a titanium nitride (TiN) layer.

6. The gate stack structure of claim 1, further comprising a conductive layer, disposed on the titanium silicide nitride layer and fills up the gate trench.

* * * * *